(12) United States Patent
Ferguson

(10) Patent No.: US 7,539,893 B1
(45) Date of Patent: May 26, 2009

(54) SYSTEMS AND METHODS FOR SPEED BINNING OF INTEGRATED CIRCUITS

(75) Inventor: Kenneth William Ferguson, Burnaby (CA)

(73) Assignee: PMC-Sierra, Inc., Santa Clara, CA (US)

( * ) Notice: Subject to any disclaimer, the term of this patent is extended or adjusted under 35 U.S.C. 154(b) by 467 days.

(21) Appl. No.: 11/513,624

(22) Filed: Aug. 31, 2006

Related U.S. Application Data

(60) Provisional application No. 60/718,624, filed on Sep. 16, 2005.

(51) Int. Cl.
*G01R 31/28* (2006.01)

(52) U.S. Cl. ............................ 714/6; 714/724; 714/741; 714/745; 716/6; 716/4; 716/8; 716/14; 716/18

(58) Field of Classification Search ........................ None
See application file for complete search history.

(56) References Cited

U.S. PATENT DOCUMENTS

| | | | |
|---|---|---|---|
| 5,039,939 A | 8/1991 | Dick et al. | |
| 5,315,242 A | 5/1994 | Enami | |
| 5,670,825 A | 9/1997 | Hyde et al. | |
| 5,796,751 A | 8/1998 | Kundu | |
| 6,219,813 B1 | 4/2001 | Bishop et al. | |
| 6,415,402 B2 | 7/2002 | Bishop et al. | |
| 6,452,435 B1 | 9/2002 | Skergan et al. | |
| 6,798,682 B2 * | 9/2004 | Chuang et al. | 365/63 |
| 6,891,395 B2 * | 5/2005 | Wells et al. | 326/38 |

(Continued)

OTHER PUBLICATIONS

Brand, et al.; Speed Clustering of Integrated Circuits; Proceedings of the International Test Conference; 2004; pp. 1128-1137.

(Continued)

*Primary Examiner*—Cynthia Britt
*Assistant Examiner*—Steven D Radosevich
(74) *Attorney, Agent, or Firm*—Knobbe, Martens, Olson & Bear LLP

(57) ABSTRACT

Methods and apparatus sort integrated circuits by maximum operating speed ($f_{max}$). The timing for a first set of critical timing paths is statistically characterized. The first set can be, for example, the set of all critical timing paths. For example, the timing can be generated by using static timing analysis (STA). The timing for a second set of critical timing paths is statistically characterized. The second set can be, for example, a sample set of critical timing paths that are measurable or are measured for a device during test. The timing can be based on STA, derived from a known good device, and the like. A device under test (DUT) is tested, and the timing for the second set of critical timing paths is determined. A fitting technique is used to fit the expected device characteristics and the measured data for the DUT, and in one embodiment, the parameters used for fitting are applied to the first set of critical timing paths, which are then used to determine an appropriate $f_{max}$ for the DUT.

34 Claims, 8 Drawing Sheets

U.S. PATENT DOCUMENTS

| | | | |
|---|---|---|---|
| 7,187,599 B2 * | 3/2007 | Schnell et al. | 365/194 |
| 7,197,728 B2 * | 3/2007 | Yonezawa | 716/4 |
| 7,257,752 B2 * | 8/2007 | Chen | 714/733 |
| 7,290,183 B2 * | 10/2007 | Shimamura | 714/700 |
| 7,290,240 B1 * | 10/2007 | Lam-Leventis et al. | 716/18 |
| 7,480,882 B1 * | 1/2009 | Song et al. | 716/6 |
| 2004/0025123 A1 * | 2/2004 | Angilivelil | 716/4 |
| 2004/0133830 A1 | 7/2004 | Lee | |

OTHER PUBLICATIONS

Cory et al.; Speed Binning with Path Delay Test in 150-nm Technology; IEEE Design and Test of Computers; Sep.-Oct. 2003; pp. 41-45.

Zeng, et al.; On Correlating Structural Tests with Functional Tests for Speed Binning of High Performance Design; Proceedings of the International Test Conference; 2004; pp. 31-37.

* cited by examiner

US 7,539,893 B1

SYSTEMS AND METHODS FOR SPEED BINNING OF INTEGRATED CIRCUITS

CROSS-REFERENCE TO RELATED APPLICATION

This application claims the benefit under 35 U.S.C. § 119 (e) of U.S. Provisional Application No. 60/718,624, filed Sep. 16, 2005, the entirety of which is hereby incorporated by reference.

BACKGROUND OF THE INVENTION

1. Field of the Invention

Embodiments of the invention are applicable to any high-performance IC requiring production speed binning, for which it is possible to accurately measure a large and distributed sample of timing paths, for example, if the design implements full-scan and supports at-speed path-delay AC scan testing, or other design for test (DFT) methodology.

2. Description of the Related Art

Many types of integrated circuits (ICs) are offered in a variety of performance grades. Vendors are able to charge a premium for a higher performance device relative to a lower performance device. See, for example, K. Brand et al., *Speed Clustering of Integrated Circuits*, Proceedings of the International Test Conference, 2004, pp. 1128-1137; B. Cory et al., *Speed Binning with Path Delay Test in 150-nm Technology*, IEEE Design and Test of Computers, September-October 2003, pp. 41-45; and J. Zeng et al., *On Correlating Structural Tests with Functional Tests for Speed Binning of High Performance Design*, Proceedings of the International Test Conference, 2004, pp. 31-37.

For example, a chip vendor can offer the identical microprocessor for sale in two or more performance grades, where the only difference among the parts is the guaranteed maximum operating frequency ($f_{max}$) specified for the grades. Generally, the part with the higher guaranteed $f_{max}$ can be sold at a higher cost. However, accurately measuring the functional $f_{max}$ of an integrated circuit during production test is relatively difficult.

Localized manufacturing defects and parametric variations can affect the $f_{max}$ of a device. See, for example, K. Brand et al., *Speed Clustering of Integrated Circuits*, Proceedings of the International Test Conference, 2004, pp. 1128-1137.

Localized manufacturing defects such as relatively resistive vias or pinholes in conductors can cause a particular path to be significantly slower than predicted by design. If the delay through the path results in the signal reaching its target after the clock edge on which it is sampled, incorrect data will be sampled and the device will not operate properly. Hence the clock should be slowed down for proper device operation, i.e., the $f_{max}$ of the device has been degraded. These defects are typically considered to be a reliability hazard as they can degrade over the lifetime of the product causing an early life failure in the end customer application.

Parametric variations can cause paths to be significantly slower (or faster) than predicted by design, resulting in correspondingly lower or higher $f_{max}$ of a device. Given the number of transistors on a deep sub-micron microprocessor, there can be on-die process variations resulting in paths within a single device varying unpredictably relative to one another, as well as process variations across a wafer resulting in all paths of some die varying relative to other die, and likewise process variations between wafers and between wafer lots. Devices with $f_{max}$ variation due to process or parametric variation are typically not considered to be defective and are relatively good candidates for speed-binning.

Critical timing paths or critical paths are those paths within an integrated circuit with relatively long delays that can limit the maximum operating frequency $f_{max}$ associated with the integrated circuit. The problem of obtaining sufficient coverage of critical timing paths for accurate $f_{max}$ determination during production test is expected to get worse over time as deep sub-micron design and fabrication processes continue to be refined. This is because as a design goal, path timing would be matched among many paths, such that many transitions would reach their destination simultaneously, and no single path would limit the clock frequency. With advances in layout tools, and the ability to trade off speed versus power for individual gates in multi-$V_t$ processes, designs are moving towards this goal, and the overall distribution of path delays is typically getting narrower. This results in a plethora of possible critical timing paths ultimately determining the $f_{max}$ for an individual IC, with the actual critical timing path of a specific die being a function of intra-die random process variations that is difficult to control or measure. Consequently there is an increased risk with any kind of $f_{max}$ testing that "the" critical timing path for a particular device is not correctly exercised, resulting in the particular device being incorrectly placed in a higher performance bin, leading to failure in a customer application, i.e., production test escapes.

Common Test Methods for Speed Binning

Functional Test

Historically, speed-binning has been accomplished by constructing functional test patterns or "vectors" for automated test equipment (ATE) and attempting to emulate normal device operation in the production test environment. The functional vectors would then be run on a pass/fail basis at various frequencies to determine the $f_{max}$ grade associated with each individual device.

The use of functional vectors on ATE is suboptimal for many reasons including: cost of test development, cost of production test, and long-term impact on device profitability. See, for example, B. Cory et al., *Speed Binning with Path Delay Test in 150-nm Technology*, IEEE Design and Test of Computers, September-October 2003, pp. 41-45, or J. Zeng et al., *On Correlating Structural Tests with Functional Tests for Speed Binning of High Performance Design*, Proceedings of the International Test Conference, 2004, pp. 31-37.

For example, test development cost can be driven by the engineering challenges of guaranteeing test coverage of critical timing paths, "cyclizing" test bench stimulus and device response to fit the constraints of ATE performance, and wasted resources due to debug time after prototype silicon is available. These problems are exacerbated with deep sub-micron system-on-chip (SOC) devices with large numbers of critical timing paths, multiple asynchronous interfaces and non-deterministic device output even for defect-free samples due to, for example, signals crossing (multiple) asynchronous clock domain boundaries, phase/frequency locked loop (PLL) sourced core clocks operating with non-deterministic phase relative to device input clocks, and the like.

Production test costs due to functional vectors can be driven by the need for relatively expensive high performance ATE systems that are capable of generating the high-speed signals used for functional stimulation of the device under test (DUT), that implement solutions for working around the problem of non-deterministic (i.e., unpredictable) DUT output signals, and that can manage the measurement challenges of placing signal edges with picosecond (ps) resolution and repeatability.

Long-term impact on device profitability comes from the lose-lose tradeoff of yield loss versus risk of specification violations and customer returns, along with the risk of test escapes due to less than 100% at-speed coverage of critical timing paths. For example, if test limits are set conservatively to guard against ATE inaccuracy, some parts will typically be down-binned into a lower speed grade (yield loss) than they are capable of performing, resulting in reduced revenue. If test limits are set aggressively to minimize yield loss, then some parts will typically be up-binned into a higher speed grade than they are capable of performing, resulting in potential failure in a customer application. This issue can be compounded by the difficulty in guaranteeing that the functional vectors used for speed-binning properly exercise the worst-case path(s) on all parts. For example, it is possible that the speed grade determined during production test is valid for the functional modes tested, but in a particular customer application, a path which was not speed tested dominates, which results in a field failure and customer return.

On-Die Process Monitor

Many ICs include circuitry on-die or in the wafer scribe channels to permit measurement of manufacturing process parameters. See, for example, K. Brand et al., *Speed Clustering of Integrated Circuits*, Proceedings of the International Test Conference, 2004, pp. 1128-1137, U.S. Pat. No. 5,039,939 to Dick, et al., or U.S. Patent Application Publication No. 2004/0133830A1 by Lee. This can include explicit test structures to directly measure transistor voltage and current characteristics, or inherently process-sensitive circuits such as a free-running ring oscillator with an output frequency that can provide a direct measurement of the timing delay through the logic forming the ring. In principle, if process parameters are sufficiently uniform over the entire die, then direct measurements of the process monitors should permit estimation of the $f_{max}$ of the DUT.

The foregoing correlation is typically not sufficiently robust to be used as the sole determinant for speed-binning a device. See, for example, K. Brand et al., *Speed Clustering of Integrated Circuits*, Proceedings of the International Test Conference, 2004, pp. 1128-1137. This is not unexpected, given on-die process Variation and difficulties in obtaining sufficient test coverage of critical timing paths.

While process monitors can provide information on the average process speed for a given device, they generally provide insufficient information on the relatively localized intra-die process variations that ultimately determine which path on a device limits the functional $f_{max}$.

At-Speed Structural Test

The challenges associated with functional vectors have resulted in an industry-wide shift towards design-for-test (DFT), which focuses on structural testing rather than functional testing and thereby enabling the use of much lower performance, lower cost ATE. Scan testing using the stuck-at fault model to detect gross manufacturing defects ("DC scan") has been a standard IC structural test for many years. More recently "AC scan" methods have become popular for detecting defects that result in degraded performance, but do not behave like a hard "stuck-at" fault. While many IC scan test methods exist, a popular implementation of AC scan is based on using scan chains to configure the memory elements, such as flip-flops or latches, in an IC at low speed prior to enabling a burst of two or more full-rate clock pulses to exercise combinational logic between the flip-flops at full speed. The results are then shifted out of the device again at low speed using the scan chains.

AC scan test coverage is typically computed by referring to one of two fault models. The transition fault model refers to the ability to detect a slow-to-rise or slow-to-fall output on any given gate. The transition fault model can be viewed as an extension to the stuck-at model (an infinitely slow transition fault being equivalent to a stuck-at fault), and is generally targeted at manufacturing defect detection. The path-delay fault model refers to the ability to detect a delay anywhere in a path from one scanned memory element to another. The path-delay fault model attempts to exercise specific logical paths and is generally targeted at testing paths with the least amount of slack to the target clock period ("critical timing paths") for specification violations that would result in a degraded $f_{max}$. See, for example, B. Cory et al., *Speed Binning with Path Delay Test in 150-nm Technology*, IEEE Design and Test of Computers, September-October 2003, pp. 41-45 or J. Zeng et al., *On Correlating Structural Tests with Functional Tests for Speed Binning of High Performance Design*, Proceedings of the International Test Conference, 2004, pp. 31-37.

AC scan vectors have a large advantage over functional vectors in that the test patterns can be generated automatically with, for example, commercial automated test pattern generation (ATPG) tools such as Mentor's FastScan tool, resulting in short development and debug cycles with completely deterministic test coverage. See, for example, B. Cory et al., *Speed Binning with Path Delay Test in 150-nm Technology*, IEEE Design and Test of Computers, September-October 2003, pp. 41-45.

Unfortunately, there are many problems in correlating $f_{max}$ measured using AC scan vectors with $f_{max}$ measured using functional vectors and/or with $f_{max}$ measured in a system environment. See, for example, J. Zeng et al., *On Correlating Structural Tests with Functional Tests for Speed Binning of High Performance Design*, Proceedings of the International Test Conference, 2004, pp. 31-37. The problems are generally attributed to the difficulty in obtaining relatively high path delay fault coverage of critical timing paths, particularly in microprocessors with embedded memory arrays. As with the other methods discussed, failure to provide 100% coverage of all possible critical timing paths can result in a risk of placing devices in a higher speed-bin than is appropriate, leading to field failures and customer returns.

Measurement of Randomly Distributed Variables

A basic understanding of statistical concepts is useful to understand the concepts presented herein. For example, see U.S. Patent Application Publication No. 2004/0133830A1 by Lee.

A normal distribution can be fully characterized by its mean and standard deviation. In practice, actual measurement data is often analyzed assuming that the data fits a normally-distributed population. By obtaining a sufficient number of measurements on samples from the distribution, it is possible to determine both the mean and standard deviation to any arbitrary confidence level, where both "sufficient number" and "confidence level" are well-defined, quantifiable values. Typically, more measurements provide better confidence that the mean and standard deviation have been accurately determined.

An approximately normally-distributed population of data does not have a well-defined peak-to-peak range. An attempt to measure a peak-to-peak range-will typically not yield a reproducible result, regardless of sample size. Typically, more measurements simply result in more opportunities for measuring an outlier value and no improved knowledge of the accuracy or repeatability of the peak-to-peak measurement.

Hence, for measurements on a normally-distributed parameter, it is much more useful to attempt to accurately determine the mean and the standard deviation, and to use these values to make statistical statements about the likelihood of observing a given value on any subsequent measurement, rather than trying to measure the peak value of the distribution directly. For example, after the mean and the standard deviation have been measured, less than 2 observations in 1000 are expected to be more than 3 standard deviations greater than the mean (single-limit calculation, i.e., integration from—infinity to +3 sigma). A single-limit calculation is appropriate for specifications like the guaranteed maximum operating frequency ($f_{max}$), where a device need only be faster than a specification. For other specifications where there is an upper and a lower range, a double-limit calculation may be appropriate. Likewise and particularly relevant to manufacturing, given a specification that is 4.5 standard deviations from the mean, 3 or less specification violations (defects) per million (DPM) devices can be expected.

This analysis can be generalized to parameters that are not distributed approximately normally, provided the distribution is well defined and known. In short, given any fully characterized distribution, it is typically possible to make statistically valid statements about the probability of finding an occurrence of a parameter beyond a given limit.

SUMMARY

The present invention comprises methods and apparatus that sort integrated circuits by maximum operating speed ($f_{max}$). In a preferred embodiment, the timing for a first set of critical timing paths is statistically characterized. The first set can be, for example, the set of all critical timing paths. For example, the timing can be generated by using static timing analysis (STA). The timing for a second set of critical timing paths is also statistically characterized. The second set can be, for example, a sample set of critical timing paths that are measurable or are measured for a device during test. The timing can be based on STA, derived from a known good device, and the like. A device under test (DUT) is tested, and the timing for the second set of critical timing paths is determined. The timing for the first set of critical timing paths is extrapolated from the test results for the second set of critical timing paths and the statistical characterization of the second set of critical timing paths. For example, a fitting technique can be used to fit the expected device timing and the measured data for the DUT. The fit parameters are applied to the expected timing for the first set of critical timing paths, and an appropriate $f_{max}$ for the DUT is determined.

Devices graded for speed can be marked with a marker associated with the speed grade. For example, a package can be physically marked with a grade for the speed, such as by a laser or with ink. In another example, the marking can be within the package and read electrically.

BRIEF DESCRIPTION OF THE DRAWINGS

These drawings and the associated description herein are provided to illustrate certain embodiments of the invention and are not intended to be limiting.

DETAILED DESCRIPTION OF PREFERRED EMBODIMENTS

Figure 1A:
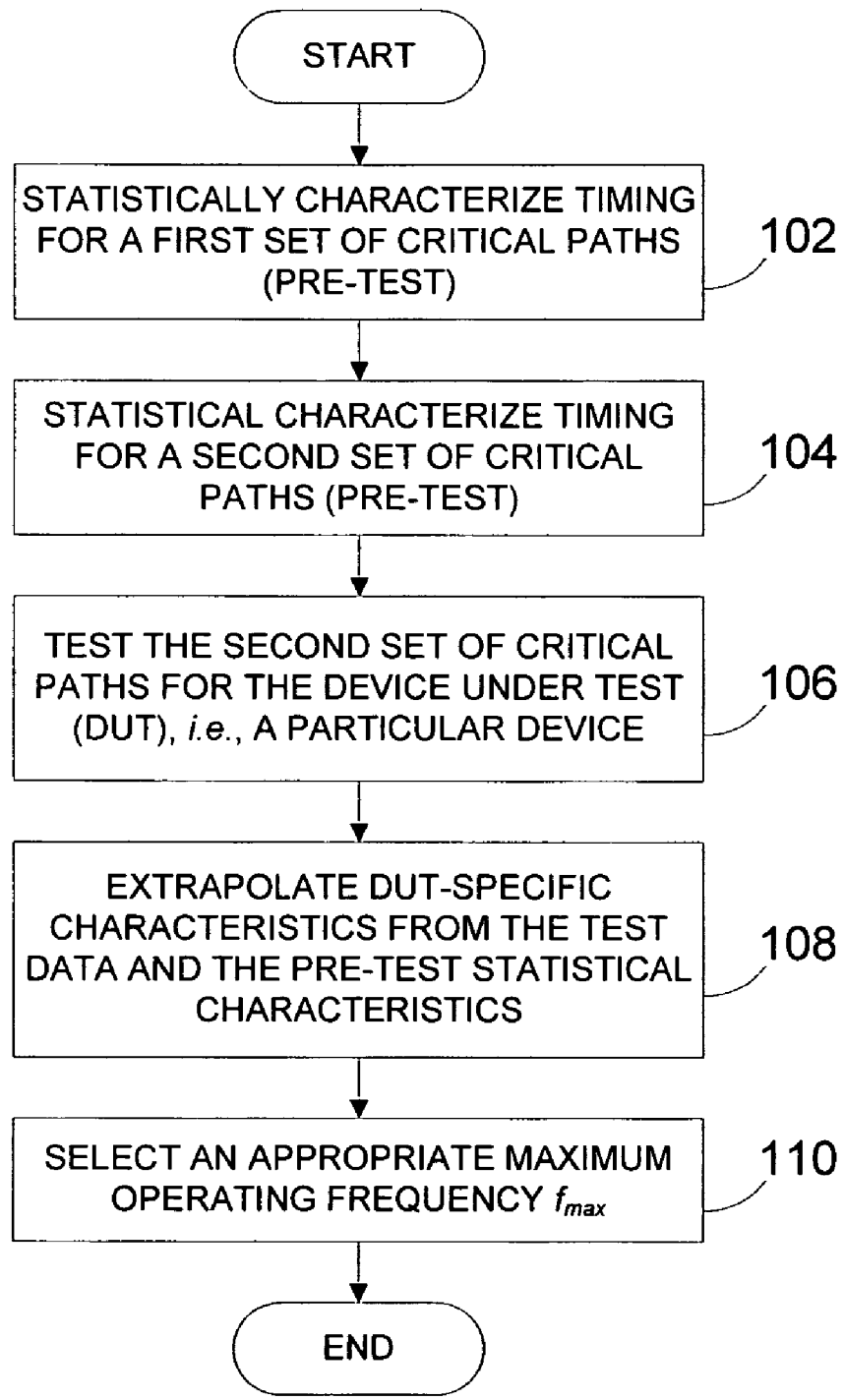
FIG. 1A is a flowchart that generally illustrates a process for speed-binning according to one embodiment of the invention.

Although particular embodiments are described herein, other embodiments of the invention, including embodiments that do not provide all of the benefits and features set forth herein, will be apparent to those of ordinary skill in the art. Nothing in this detailed description or the foregoing summary is intended to imply that any particular feature, step or element is essential to the invention. The invention is defined only by the claims.

The disclosed techniques can be used to grade parts, such as microprocessors, into two or more frequency bins. It can be common for electronic parts to vary substantially in guaranteed maximum operating frequency ($f_{max}$) even though all of the parts may be of the same design and fabricated by the same process (same family). For example, the thickness of an oxide layer can vary during fabrication, which can affect the $f_{max}$.

Embodiments of the invention can provide many economic benefits to an IC vendor. For example, development cost for test can be greatly reduced by reducing or eliminating generation, coverage analysis, and debug of functional vectors. In addition, the debug of functional vectors can be time consuming and delay initial production shipments. Elimination of functional vectors for test can also reduce the costs of associated test equipment. However, functional vectors can be used if desired. Furthermore, improving the accuracy of the determination of the maximum operating frequency $f_{max}$ can also improve yield and also reduce the number of "production escapes."

One embodiment of the invention includes a method for speed-binning high performance ICs that is relatively accurate even when applied to complex deep sub-micron SOC devices. As an additional benefit, an embodiment of the invention does not need to depend on functional vectors, thereby providing efficient production test program development and debug on relatively low-cost structural ATE platforms. One embodiment according to the invention can provide speed-binning of relatively high-performance ICs, which does not need to use functional vectors; can be implemented in production on a low-cost structural ATE system; and can provide relatively accurate $f_{max}$ determination without 100% test coverage of critical timing paths.

A device is typically initially screened for manufacturing defects using, for example, a suite of structural and DC parametric tests, such as continuity testing, input/output levels testing, IDDX testing, boundary scan, DC (stuck-at) scan patterns, and AC (transition fault) scan patterns. Provided these tests obtain acceptably high coverage, then failures related to spot-defects should be reduced to an acceptable level. Thereafter, the performance grade of an integrated circuit can be determined by the timing of its critical timing paths.

One embodiment of the invention uses statistical analysis of a distribution of path speeds on the DUT (as opposed to only the worst-case measured path). By correlating the measured distribution of the sample of paths with the predicted distribution of those paths and with the predicted distribution of relatively many, such as all critical timing paths (based on simulation and/or characterization of known-good integrated circuit), it is possible to make quantifiable statistical statements about the worst-case path on the DUT, whether it was in the measured sample or not; i.e., it is possible to speed-bin the DUT accurately without 100% test coverage of critical timing paths.

In one embodiment, path-delay AC scan vectors are used for the path distribution measurement. A problem with path-delay coverage has been that the test coverage is relatively low, such as, for example, 5-30%. Other techniques, such as the level-sensitive scan device (LSSD) test method can also be used. See, for example, U.S. Pat. No. 5,039,939 to Dick, et al. For example, LSSD-based AC scan vector can be used, an LSSD-based path delay measurement can be used, and the like.

Method for Speed Binning Integrated Circuits Using Path Timing Distribution Analysis Before the speed-binning process begins, it is typically desirable to screen devices for spot defects with, for example, a standard suite of manufacturing defect tests. Ignoring such defects for subsequent analysis, the speed-binning for a DUT should be determined by determining the worst-case timing for a critical timing path of the DUT, bearing in mind that the specific path with the worst-case timing will vary from device to device and can typically be any of a relatively large number of critical timing paths, many of which can be difficult or impractical to sensitize during production test.

According to one embodiment of the invention, the speed-binning for a DUT is determined by quantifying the statistical likelihood that any critical timing path on the DUT violates a given specification and determining how to rate the performance of a particular device, that is, the DUT, based on that information.

The speed binning technique analyzes the distribution of timing paths as a probability density function (PDF) P(t). These functions are also known as probability mass functions and probability distributions. In the context of speed binning, a relevant inquiry is to determine the probability of one or more members (critical timing paths) of population P being slower than a selected specification limit t, where t is the inverse of the maximum operating frequency $f_{max}$.

Conversely, for a given acceptable quality level (AQL), a relevant inquiry is to determine the smallest value of specification limit t such that the probability of one or more members of population P exceeding t is less than the acceptable quality level (AQL). In one embodiment, the latter probability is determined by integrating population P(t) to construct a complementary cumulative distribution function (CCDF) C(t), then locating the value of the CCDF C(t) that corresponds to the acceptable quality level AQL, and then using the corresponding value of the selected specification limit t for speed binning. The CCDF is the complement of the cumulative distribution function (CDF) such that the CCDF for a random variable can be calculated by subtracting the CDF of the random variable from 1.

Because 100% test coverage of critical timing paths is typically not possible or practical, the challenge is to determine with accuracy the characteristics of population P(t) (e.g., first set of timing paths) based on the sample of timing paths (e.g., second set) that are measured. In the illustrated embodiment, this is accomplished by generating a PDF to describe the population of all critical timing paths, deriving a CCDF from the PDF, and then fitting the CCDF to values from the measured population. In one embodiment, the modified CCDF describes the entire population of modeled critical timing paths. An overview of the binning process will now be described with reference to FIG. 1A. Further details and an example of the binning process will be described with reference to FIGS. 1B-1D and 2-4, 5A, 5B, and 6-9. In FIGS. 2-4, 5A, 5B, and 6-9, the path timing (time) in picoseconds is represented along the x-axis.

Overview Process

FIG. 1A is a flowchart that generally illustrates a process for speed-binning according to one embodiment of the invention. The procedure begins by statistically characterizing 102 timing for a first set of critical timing paths. Preferably, the first set of critical timing paths is the set of all critical timing paths for a device, whether measurable by test equipment or not. It should be noted that this statistical characterization does not need to be performed for each device under test (DUT), that is, the statistical characterization is non-DUT-specific. A process for statistically characterizing 102 the timing for the device family will be described in greater detail later in connection with FIG. 1B.

The procedure advances to a step 104 to statistically characterize timing for a second set of critical timing paths. Preferably, the second set of critical timing path is the set of all measurable critical timing paths for a device, but it will be understood that for efficiency or test equipment limitations, fewer than all of the measurable critical timing paths may be used. It should be noted that this statistical characterization also does not need to be performed for each DUT, that is, the statistical characterization is non-DUT-specific. Statistically characterizing 104 will be described in greater detail later in connection with FIG. 1C.

The procedure advances to test 106 the timing of the second set of critical timing paths for the DUT. It should be noted that this test 106 is specific to a particular device, that is, the DUT. It should also be noted that when a particular device is tested, other tests such as scan testing and the like for the detection of gross manufacturing defects ("DC scan") are also typically performed and can be performed at the same time. As will be described in greater detail later, one embodiment of the procedure tests the DUT at operating speeds for which some paths of the second set of critical timing paths are expected to fail such that a failure profile can be generated and compared with expected profiles. Testing 106 will be described in greater detail later in connection with FIG. 1D.

The procedure advances to extrapolate DUT-specific characteristics from the test data for the DUT and from the pre-test statistical characteristics. For example, the statistical characteristics of the second set of critical timing paths can be fit to the measured test results using a technique such as least squares. Other curve-fitting techniques will also be readily determined by one of ordinary skill in the art. The parameters observed for fitting, such as a timing offset, can then be applied to the first set of critical timing paths to extrapolate the critical timing path timing for the first set from the measurements for the second set. Extrapolating data 108 will also be described in greater detail later in connection with FIG. 1D.

The procedure then selects 110 an appropriate maximum operating frequency $f_{max}$ for the DUT. For example, a particular specification violation probability can be used by a vendor to grade the devices by speed. The vendor can include a form of marking to indicate the particular grade for a particular device. For example, a case for the package can be marked. In another example, the grade of a device can be indicated electrically, such as via the content of a memory address, blowing of fuses, internal wiring of pins, and the like.

Statistical Characterization of the First Set of Critical Timing Paths

Figure 1B:
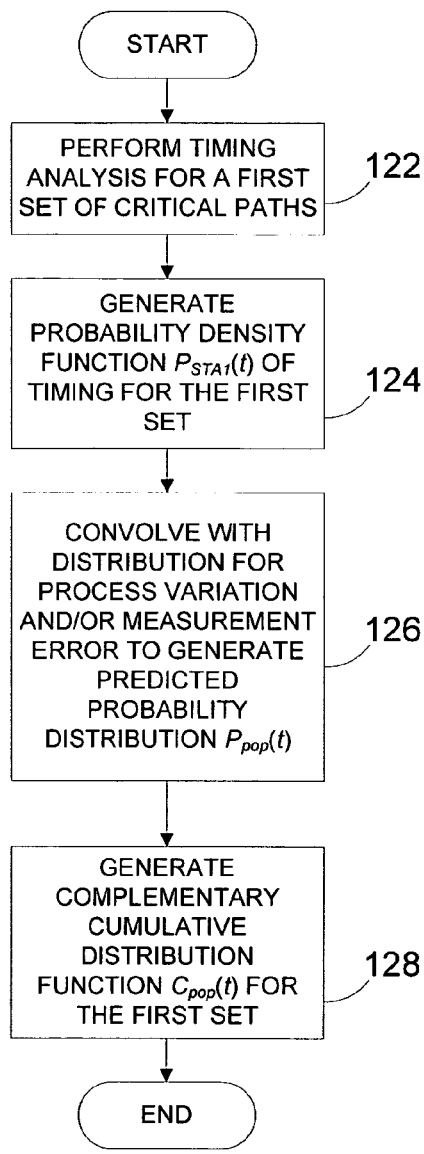
FIG. 1B is a flowchart that generally illustrates a process for statistical characterization of a first set of critical timing paths.
Figure 2:
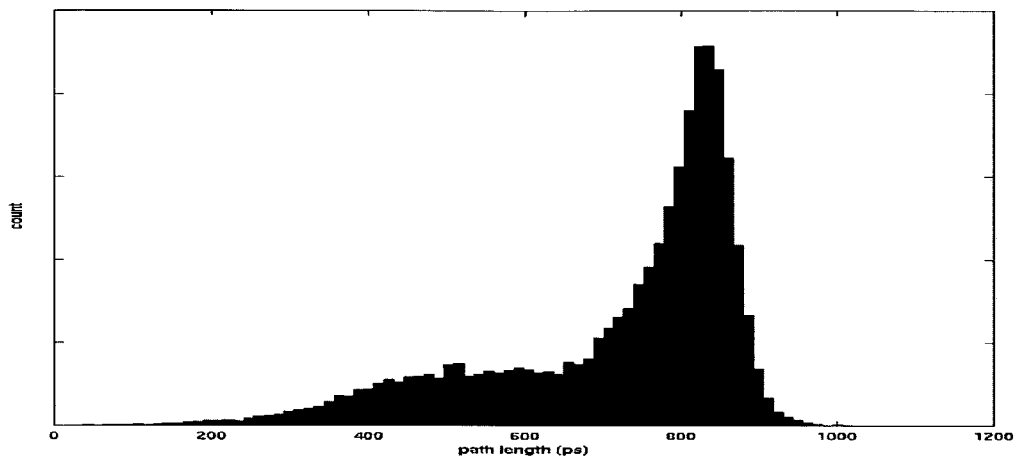
FIG. 2 is a histogram of the expected path timing distribution for a first set of critical timing paths for a device.

FIG. 1B is a flowchart that generally illustrates a process for statistical characterization of the first set of critical timing paths. The procedure analyzes 122 the expected timing for the first set of paths for the device. The expected timing is typically general to the parts in the family for a particular fabrication process and to the test equipment used. It is typically not specific to a DUT. In the illustrated embodiment, static timing analysis (STA) techniques are used to generate the expected timing for the first set of paths. While the speed binning process will be described in the context of static timing analysis (STA), one of ordinary skill in the art will recognize that other timing analysis techniques, such as circuit simulation techniques, can also be used. In addition, combinations of techniques can be used, such as using STA techniques for all but the measurable paths and using measured data for the measurable paths, or combinations of STA techniques and circuit simulation techniques, and the like. One advantage of using STA is that it is relatively efficient to use, is relatively accurate, and provides a distribution of path timings. An example of a histogram of the expected timing for the first set of paths for a device is illustrated in FIG. 2.

In the illustrated design example, the device is intended for operation for a grade with a maximum operating speed $f_{max}$ of 900 MHz (1.11 ns clock period). Preferably, the device is designed with support for at-speed AC scan using a path delay model. The histogram of FIG. 2 graphically displays the collected timing data in counts (frequencies of occurrence) as indicated by the y-axis. In the illustrated histogram, the counts are displayed in groups of about 12.5 to 15 picoseconds (ps) along the x-axis for the purposes of display, but it will be understood that the underlying data does not need to be grouped in this manner. The data for the histogram of FIG. 2 is representative of devices of the same IC design fabricated with the same nominal process as the DUT, for example, for all the devices of the same microprocessor design.

Figure 3:
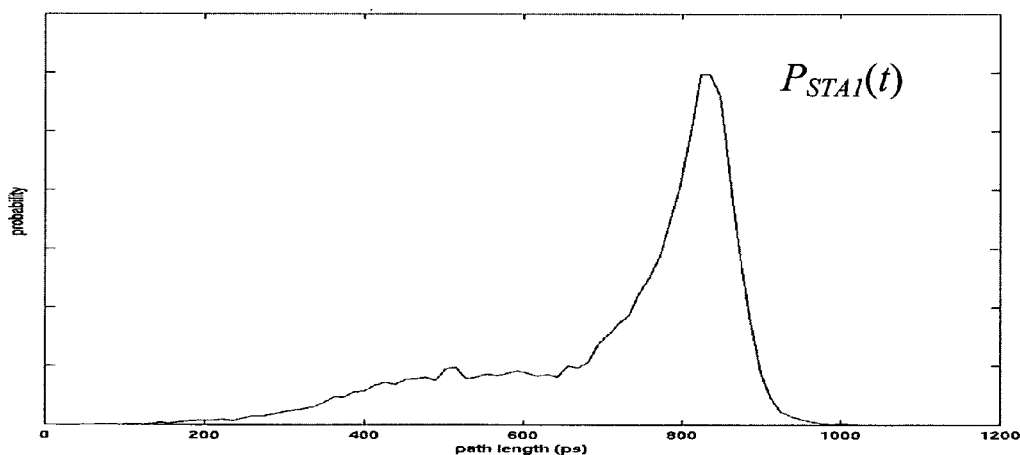
FIG. 3 is a graph of a probability density function (PDF) of the expected path timing distribution $P_{STA1}(t)$.

The procedure then advances to generate 124 a PDF $P_{STA1}$(t) for the timing of the first set. For example, the data of tabulated frequencies for the histogram illustrated in FIG. 2 can be normalized into the PDF $P_{STA1}$(t) as illustrated in FIG. 3. Probability density is indicated along the y-axis.

Figure 4:
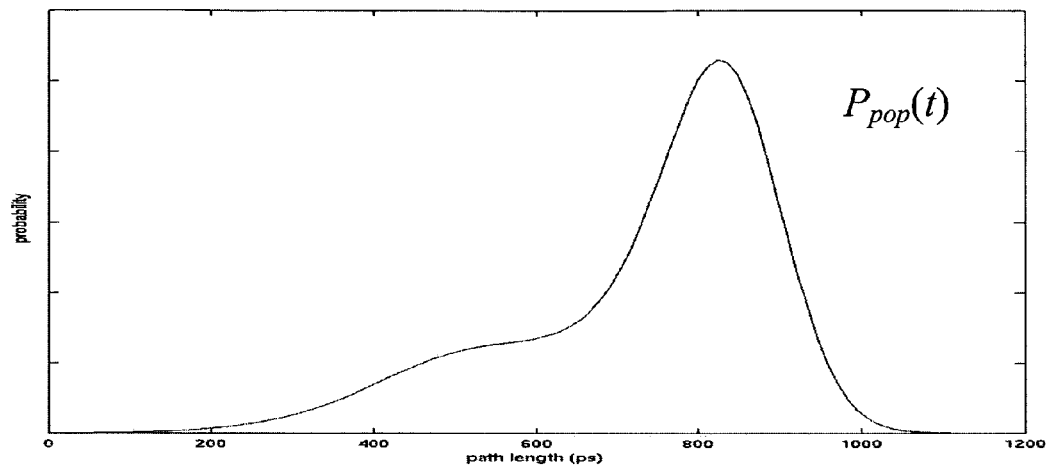
FIG. 4 is a graph of a PDF of the expected overall path timing distribution $P_{pop}(t)$, constructed by convolving the PDF of FIG. 3 with PDFs for path timing variations due to process variation and measurement error.

The procedure proceeds to generate 126 a predicted PDF $P_{pop}$(t), an example of which is illustrated in FIG. 4. In one example, the predicted PDF $P_{pop}$(t) is generated from the PDF $P_{STA1}$(t) by convolving $P_{STA1}$(t) with PDFs for process variation and measurement error. Process variations can include intra-die variations and inter-die process variations. Intra-die process variations can typically be approximated with a normal or Gaussian distribution across the population of timing paths on a given DUT, while inter-die process variations can be approximated with a constant scaling factor applied to the entire population of timing paths on a given DUT or the DUTs of a given fabrication lot such as a wafer or a batch of wafers. Measurement error distribution typically depends on the ATE specifications, and is typically also approximated by a normal distribution. However, other distributions can also be applicable.

Figure 5A:
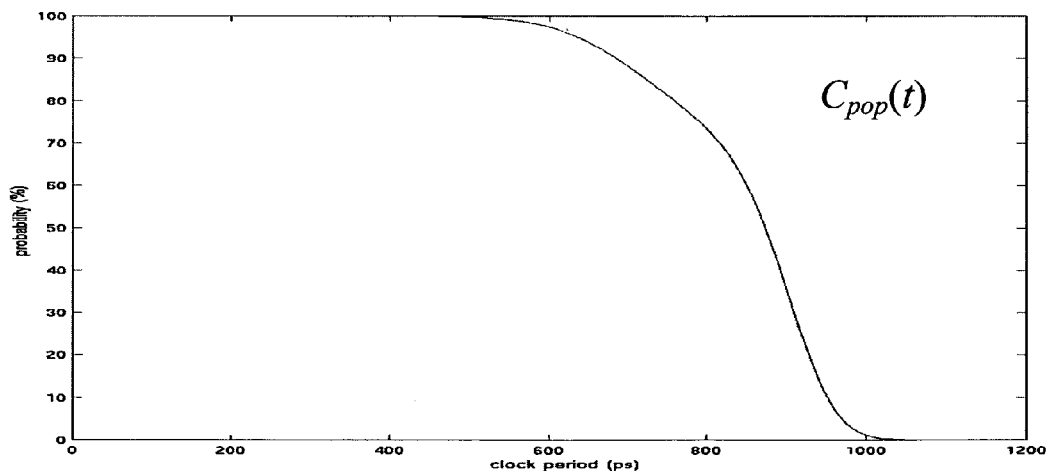
FIG. 5A is a graph of a complementary cumulative distribution function (CCDF) $C_{pop}(t)$ of the expected overall path timing distribution $P_{pop}(t)$ with percentage indicated along the vertical axis.
Figure 5B:
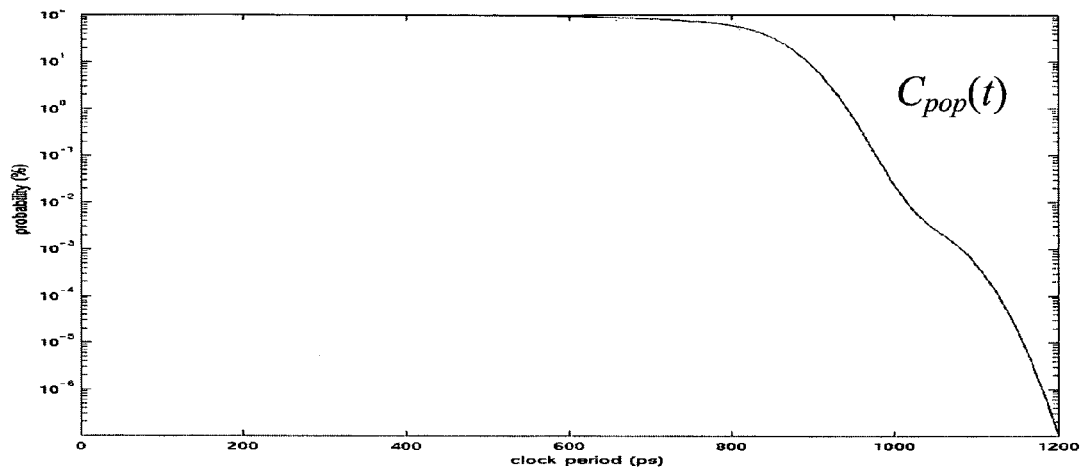
FIG. 5B is a graph of the CCDF $Cp_{pop}(t)$ of the expected overall path timing distribution $P_{pop}(t)$ in log scale.

The procedure then generates 128 a predicted CCDF $C_{pop}$(t), an example of which is illustrated in FIG. 5A and in FIG. 5B. The same data is shown in FIGS. 5A and 5B. Probability from 0 to 100% is represented linearly along the y-axis of FIG. 5A. Probability from $10^{-7}$% (0.0000001%) to $10^2$% (100%) is represented in logarithmic scale along the y-axis of FIG. 5B. The predicted CCDF $C_{pop}$(t) can be computed by subtracting from unity the integral of the PDF $P_{pop}$(t) from short or fast timing path to long or slow timing (left to right along the time axis of FIG. 4). The predicted CCDF $C_{pop}$(t) represents the probability that one or more paths on a nominal device, i.e., not necessarily for the particular DUT, will exceed a delay value t (represented along the x-axis). The procedure illustrated in FIG. 1B can be re-executed as appropriate for design changes, process changes, test equipment changes and the like.

The CCDF $C_{pop}$(t) illustrated in FIGS. 5A and 5B describes the population of the first set of critical timing paths for the device. Preferably, the first set of critical timing paths includes all of the critical timing paths, but it will be understood that a representative set can also be used. This population (first set) is typically larger than the set of timing paths that are actually selected for measurement (second set). Preferably, all of the measurable paths are measured for the second set, but it will be understood that a smaller subset may be selected for measurement. The measurable or testable paths are readily identifiable. For example, an automated test pattern generation (ATPG) tool can be used to identify such paths. For the second set of timing paths, the following process described in connection with FIG. 1C is performed.

Statistical Characterization of the Second Set of Critical Timing Paths

Figure 1C:
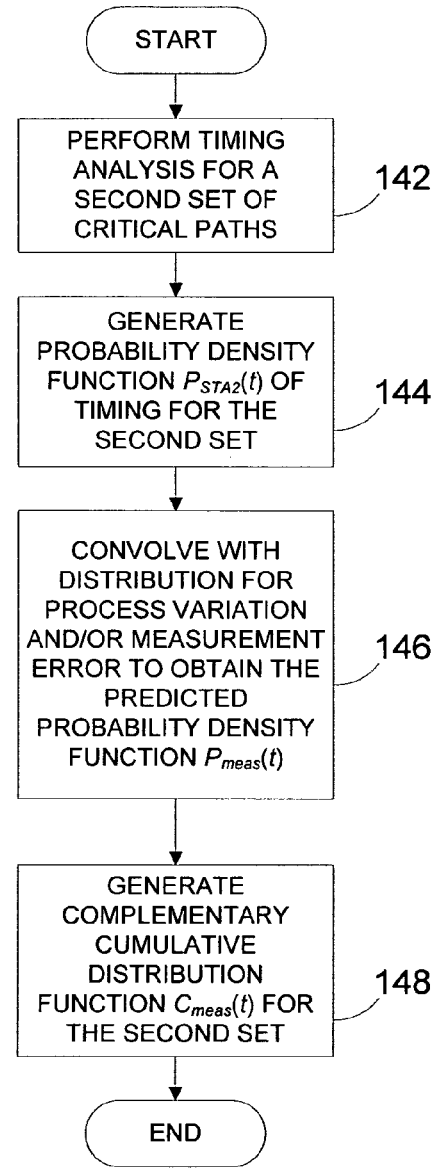
FIG. 1C is a flowchart that generally illustrates a process for statistical characterization of a second set of critical timing paths.

FIG. 1C is a flowchart that generally illustrates a process for statistical characterization of the second set of critical timing paths. The procedure of FIG. 1C is generally similar to the procedure of FIG. 1B. The procedure begins by performing 142 a timing analysis for the second set of critical timing paths. As described earlier in connection with the step 122 of FIG. 1B, static timing analysis (STA) can be used to generate such timing analysis. Circuit simulation techniques can also be used. In addition, as the second set of critical timing. paths are measurable paths, one or more known good devices from the family of devices can also be tested, and the test results used for the timing analysis. In one embodiment, the timing analysis 142 for the second set of critical paths is selected from the timing analysis performed 122 for the first set of critical paths.

The estimated timing data for the second set is typically general for a particular IC design, that is, the estimated timing data does not need to be recalculated for each device under test (DUT). In one embodiment, the AC scan path delay vectors for these critical timing paths are constructed using, for example, an automated test pattern generation (ATPG) tool. For example, the second set can correspond to the critical timing paths with slack time of less than 10% of the clock period based on analysis from STA. The number of critical timing paths tested can vary in a very broad range. However, typically, the number of critical timing paths tested is limited to some predetermined number, such as 10,000 paths, to accommodate memory limitations of the test equipment and to have a practical test time. Accordingly, the second set can be a smaller subset than the set of measurable critical timing paths.

Figure 6:
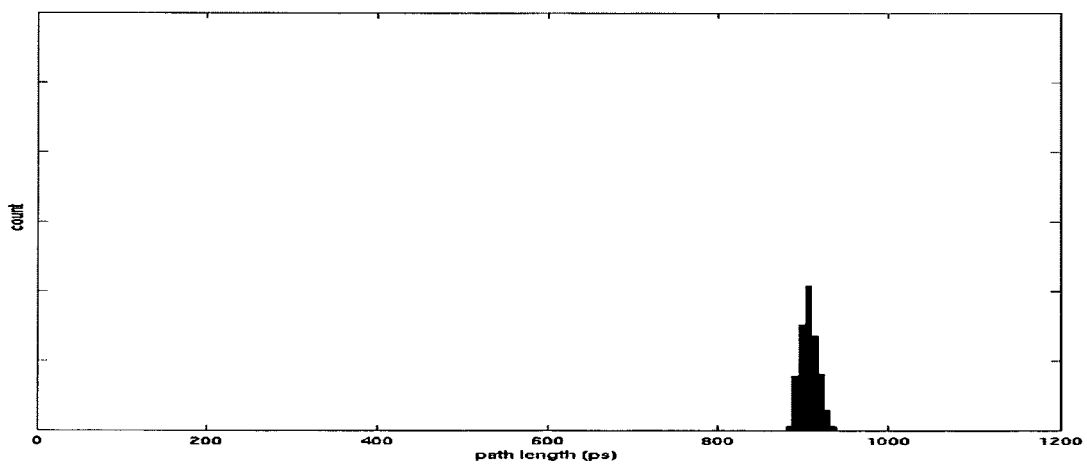
FIG. 6 is a histogram of the expected path timing distribution for a second set of critical timing paths.

As illustrated by the histogram for the estimated timing of the second set of timing paths in FIG. 6, the measurable timing paths typically form a smaller subset of all the paths. A path length in units of time (picoseconds) is illustrated along the x-axis. The y-axis indicates the count of the paths with the corresponding path lengths. Preferably, timing data for all of the measurable paths are used, but it will be understood that the actually measured data can be a smaller subset than the measurable paths.

The timing analysis for the second set of paths is used to generate 142 a PDF $P_{STA2}(t)$ (not shown graphically) for the second set of timing paths. The estimated data for the histogram of FIG. 6 can be normalized to the PDF $P_{STA2}(t)$ using, for example, the same techniques described earlier in connection with step 124 of FIG. 1B and with FIG. 3. This PDF $P_{STA2}(t)$ is then convolved 146 with process variation PDFs and with measurement error PDFs (not shown) to obtain a predicted PDF $P_{meas}(t)$ (not shown graphically) for the second set of paths.

Figure 7:
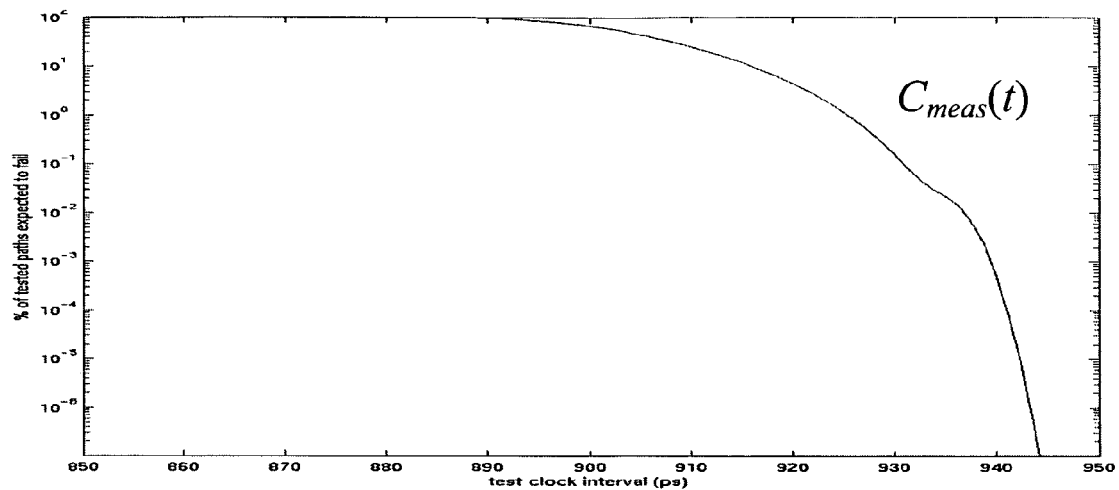
FIG. 7 is a graph of the CCDF $C_{meas}(t)$ for the expected path timing distribution for the second set of critical timing paths, where the CCDF is constructed in a similar manner to the CCDF of FIG. 5B, but starting from the histogram of FIG. 6.

The procedure then integrates the PDF $P_{meas}(t)$ to generate 148 a CDF, which is subtracted from unity to form a CCDF $C_{meas}(t)$ for the estimate of the second set of timing data. An example of the CCDF $C_{meas}(t)$ is illustrated in FIG. 7. The y-axis of FIG. 7 indicates the percentage of tested paths expected to fail, and ranges in logarithmic scale from $10^{-7}$% (0.0000001%) to $10^2$% (100%). The CCDF $C_{meas}(t)$ represents the probability of one or more paths within the second set failing when tested with the corresponding test clock period. By contrast, the CCDF $C_{pop}(t)$ illustrated in FIG. 5B is for the probability of failure among the first set of critical timing paths, such as all the critical timing paths.

The foregoing functions can be reused for the testing of multiple devices. However, it will be understood that, for example, devices of different die can have different intra-die process variations and that the measurement error distribution can vary depending on the particular test equipment used for the DUT. In one embodiment, relatively highly-distributed process monitors are used to monitor process variations. These monitored process variations can be used to further refine the process variation PDFs which are convolved with the path delay PDF. The procedure illustrated in FIG. 1C can be re-executed as appropriate for design changes, process changes, test equipment changes and the like.

Testing of a DUT and Extrapolating Test Results

Figure 1D:
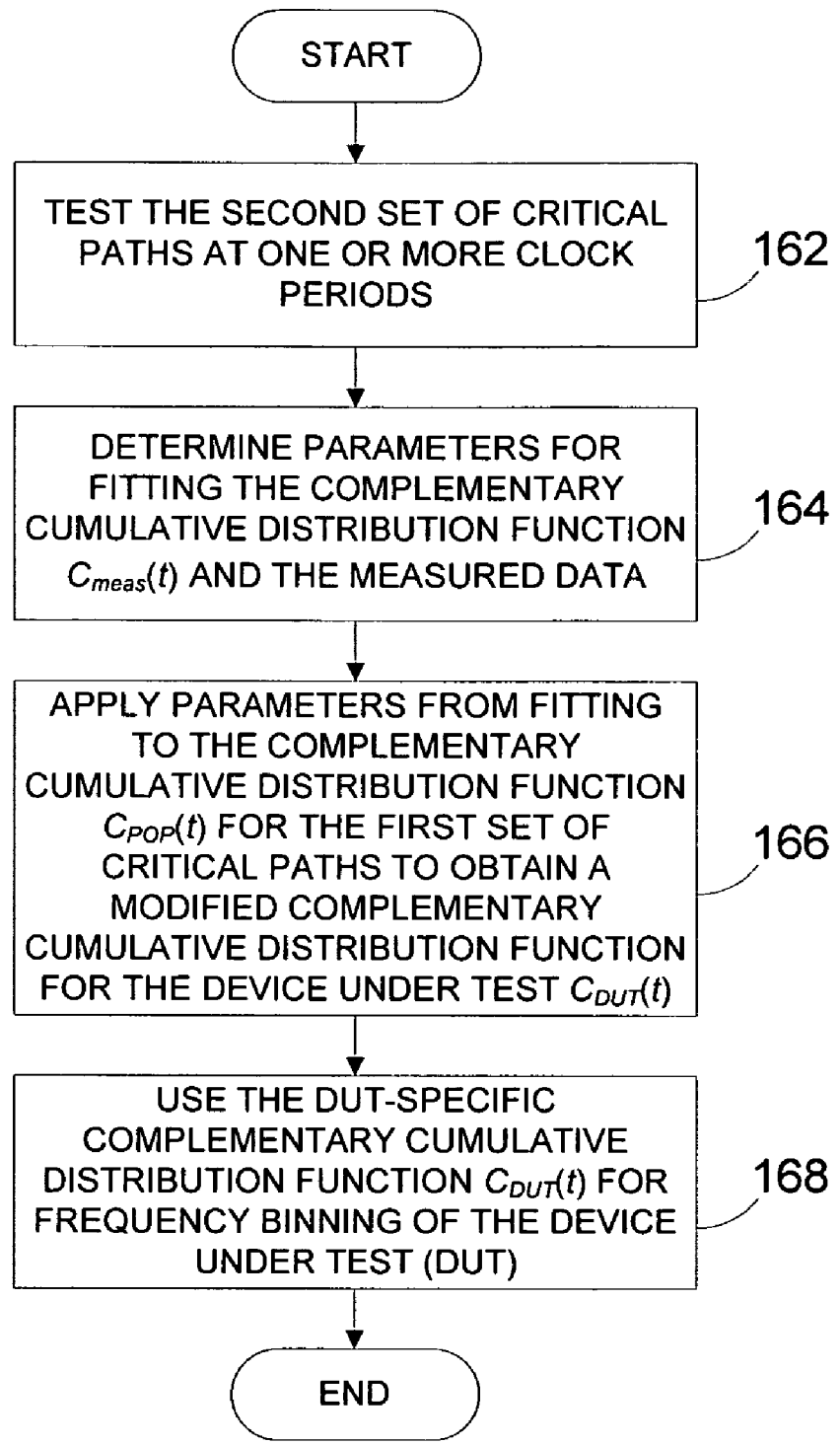
FIG. 1D is a flowchart that generally illustrates a process for testing the DUT and extrapolating DUT-specific characteristics of the critical timing paths of the DUT.

Procedures for testing and grading a particular device, that is, a device under test (DUT), will now be described. FIG. 1D and its accompanying description illustrate in further detail the portion of the procedure described earlier in connection with FIG. 1A corresponding to testing 106 the DUT and extrapolating 108 DUT-specific characteristics of the critical timing paths of the DUT.

The procedure begins by testing 162 the second set of critical timing paths using one or more clock periods or delay times. At least one of the selected clock periods should be short. enough to provide a meaningful amount of data to analyze. For example, when a selected clock period for test is somewhat shorter than the reciprocal of the intended maximum operating frequency $1/f_{max}$, then a statistically meaningful number of critical timing paths can be expected to fail. In addition, a relatively larger count of failing paths will typically exhibit a smaller associated standard error. The count of the failing paths can be collected off chip or can be collected within the device. In the illustrated example, the device is intended for operation at $f_{max}$ of 900 MHz (1.11 ns or 1111 ps clock period).

Figure 8:
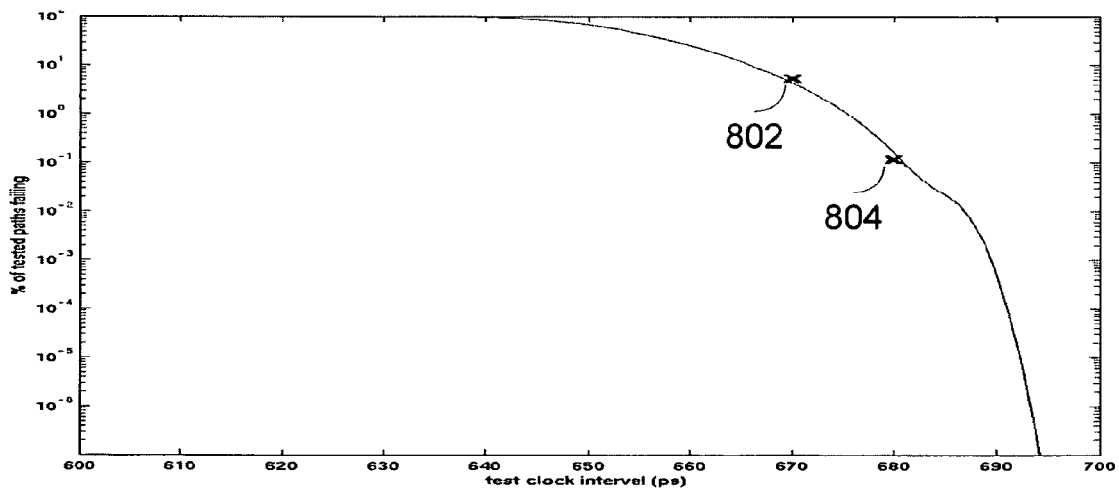
FIG. 8 illustrates fitting the CCDF $C_{meas}(t)$ to the measured data points $M_p(tn)$ for a particular DUT.

A first delay time $t_1$ is selected. In one embodiment, the AC scan vectors are run by the ATE during test of the DUT using this delay time $t_1$ as the functional clock interval. In another embodiment, the AC scan vectors are generated by internal logic built in self test (BIST). The number of failing paths $M(t_1)$ encountered during test with the first delay time $t_1$ is counted. Optionally, one or more additional delay times $t_2 \ldots t_n$ for test can be selected, and the test repeated to provide more data points for subsequent curve fitting. In one embodiment, at least two delay times are used as illustrated in FIG. 8. The y-axis of FIG. 8 indicates the percentage of tested paths expected to fail, and ranges in logarithmic scale from $10^{-7}$% (0.0000001%) to $10^2$% (100%). For analytic tractability, the number of failing paths M(t) at a particular operating speed is typically normalized into probability values $M_p(t)$ by division by the total number of paths tested.

In the prophetic example using representative data from experiments with real devices illustrated in FIG. 8, the automated test equipment (ATE) tests the DUT at 670 ps clock period (equivalent to an operating frequency of 1.49 GHz) and 680 ps clock period (equivalent to an operating frequency of 1.47. GHz) for a first measured probability 802 and for a second measured probability 804, respectively. As indicated by the first measured probability data 802, about 5.5% of the paths fail for the DUT with a 670 ps clock period. As indicated by the second measured probability data 804, about 0.12% of the measured paths fail at 680 ps clock period.

The procedure then determines 164 the parameters for fitting the CCDF $C_{meas}(t)$ obtained earlier in the step 148 and the measured data for the DUT. For example, the CCDF $C_{meas}(t)$ can be fitted 164 to the measured data 802 and 804 as shown in FIG. 8. In another embodiment, the measured data 802, 804 can be fitted to the CCDF $C_{meas}(t)$ instead. What is sought is the relationship between the CCDF $C_{meas}(t)$ and the measured data.

For example, a curve-fitting algorithm, such as least squares, can be used to match the CCDF $C_{meas}(t)$ to the measured points of the probability values $M_p(t)$. A computationally efficient method of fitting is to slide the CCDF $C_{meas}(t)$ along the time axis without scaling, to minimize the error term $\Sigma(M_p(t_n)-C_{meas}(t_n))^2$. In the illustrated embodiment, the CCDF $C_{meas}(t)$ is fitted to the measured data 802, 804 (indicated by "x" marks in FIG. 8) by offsetting the CCDF $C_{meas}(t)$ by about 250 ps (shifting the curve to the left). It will be understood that the chart illustrated in FIG. 8 does not need to be generated, but rather, is illustrated for ease of comprehension. In the illustrated example, the parameter for fitting corresponds to an offset time $t_{offset}$ of about negative 250 ps.

Figure 9:
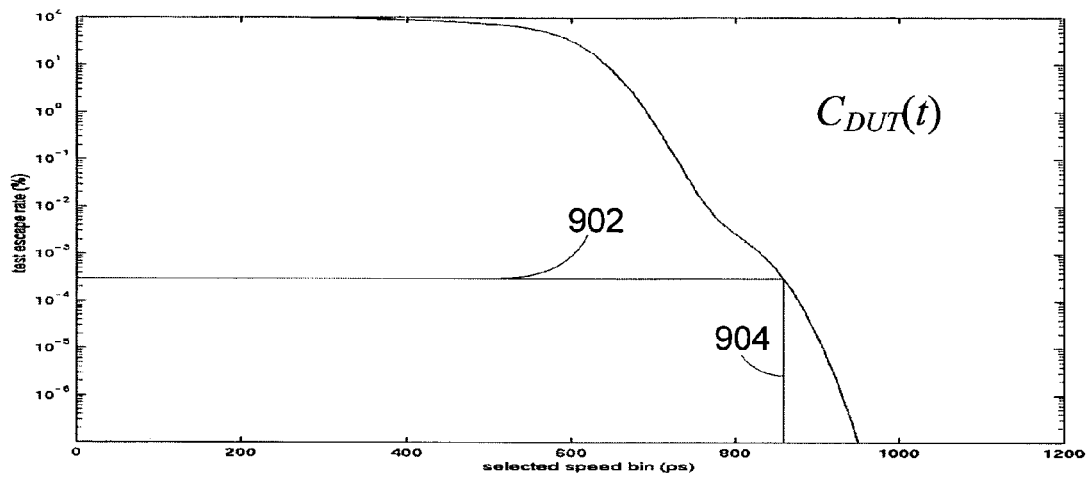
FIG. 9 illustrates a path violation probability curve $C_{DUT}(t)$ obtained by applying the DUT-specific parameters obtained from fitting the CCDF $C_{meas}(t)$ to measured data points as illustrated in FIG. 8 to the CCDF $C_{pop}(t)$ of the expected overall path timing distribution $P_{pop}(t)$.

The procedure then applies 166 the parameters obtained in the step 164 (e.g., −250 ps) for the CCDF $C_{meas}(t)$ to the CCDF $C_{pop}(t)$ described earlier in connection with the step 126 of FIG. 1B and originally illustrated in FIG. 5B. This modifies the CCDF $C_{pop}(t)$ to a DUT-specific CCDF $C_{DUT}(t)$, which describes the probability that one or more paths of the DUT exceed a selected path delay limit t. An example of the CCDF $C_{pop}(t)$ after application of the fitting parameters is illustrated in FIG. 9. The path delay time is expressed along the x-axis. The probability of path timing violation from 0% to 100% in logarithmic scale is expressed along the y-axis. The extracted value illustrated in FIG. 9 represents the probability that the timing of one or more paths on the measured device will be violated in a user's application if run at a clock rate corresponding to the clock period shown along the x-axis. This corresponds to the test escape rate, or percentage of tested parts likely to fail in a user's application if run at the clock rate corresponding to the clock period so determined on a device-by-device basis.

Other techniques can be used to determine parameters for fitting and to apply these parameters to generate the DUT-specific CCDF $C_{DUT}(t)$. For example, the CCDF $C_{meas}(t)$ can be fitted by scaling instead of or in addition to using time offsets. In another example, an iterative process can be used to vary the parameters of the process variation and measurement error probability density functions as described in the step 146 of FIG. 1C to generate a DUT-specific $P_{meas}(t)$ that is integrated to obtain a fitted-version of the CCDF $C_{meas}(t)$. The iterations can continue until, for example, a satisfactory fit to the measured data is obtained. These process variations and measurement error probability density functions can then be reapplied to the predicted PDF $P_{pop}(t)$ to generate the DUT-specific CCDF $C_{DUT}(t)$.

The procedure then proceeds to use 168 the DUT-specific CCDF $C_{DUT}(t)$. for frequency binning, that is, grading, of the device under test (DUT). For example, a particular acceptable quality level (AQL) can be selected on the DUT-specific CCDF $C_{DUT}(t)$, and the corresponding value $t_{AQL}$ used to select an appropriate maximum operating frequency $f_{max}=1/t_{AQL}$ for the DUT.

For example, a value for acceptable quality level (AQL) can be selected. An example of such a value is 3 defects per million (DPM) or 0.0003%. A value of time delay $t_{AQL}$ for which the DUT-specific CCDF $C_{DUT}(t)$ is less than or equal to the AQL is identified. The device $f_{max}$ is then computed as the inverse of the time delay $t_{AQL}$ and the device can be speed-binned accordingly. A horizontal line 902 in FIG. 9 indicates an AQL of 3 DPM. The horizontal line 902 intersects the curve for the DUT-specific CCDF $C_{DUT}(t)$ at about 870 ps as indicated by a vertical line 904. The corresponding $f_{max}$ computation of 1/870 ps is about 1.15 GHz, which is well in excess of the 900 MHz target for the design example, so the DUT or particular device can be speed-binned (graded) into a 900 MHz grade or even higher.

Figure 10:
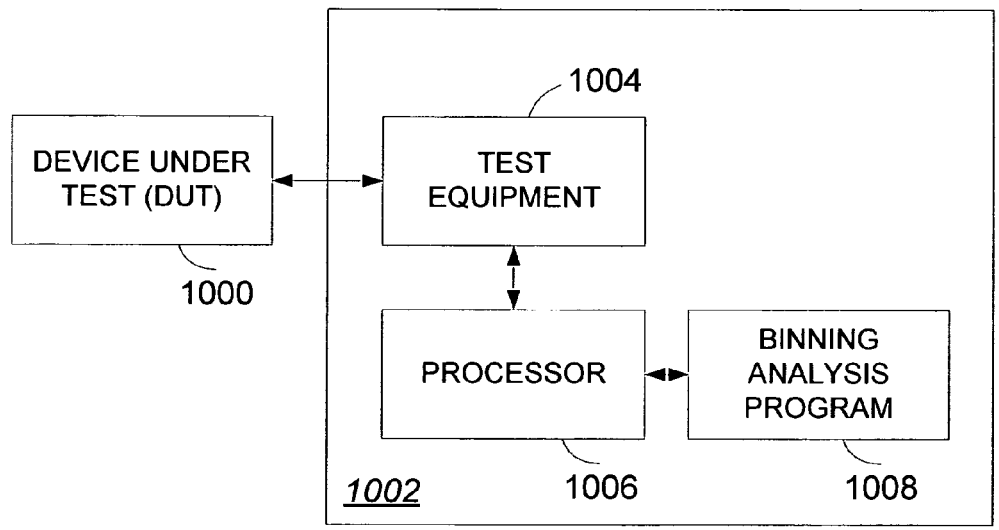
FIG. 10 illustrates an example of a system for evaluating a maximum operating speed of a DUT.

FIG. 10 illustrates an example of a system 1002 for evaluating a maximum operating speed of a device under test (DUT) 1000. The system 1002 includes test equipment 1004, such as automated test equipment (ATE), and a processor 1006. The test equipment 1004 tests the various critical timing paths of the DUT 1000 at one or more operating frequencies. The processor 1006 evaluates the data obtained during the test.

One embodiment further includes a binning analysis program 1008 that can be embodied in a computer-readable medium or computer storage device. For example, the computer-readable medium can include an addressable storage medium such as random access memory (RAM), an electronically erasable programmable read-only memory (EEPROM), flash memory, hard disks, floppy disks, Compact Disc ROMs, DVD-ROMs, and the like.

It will be appreciated by the skilled practitioner that the illustrated processes can be modified in a variety of ways without departing from the spirit and scope of the invention. For example, various portions of a process can be combined, can be rearranged in an alternate sequence, can be removed, and the like.

Various embodiments of the invention have been described herein. Although this invention has been described with reference to these specific embodiments, the descriptions are intended to be illustrative of the invention and are not intended to be limiting. Various modifications and applications may occur to those familiar with the subject without departing from the true spirit and scope of the invention as defined in the appended claims.

What is claimed is:

1. A method for evaluating an integrated circuit, the method comprising:
   generating an estimate of a timing distribution for a first set of critical timing paths of the integrated circuit;
   generating an estimate of a timing distribution for a second set of critical timing paths of the integrated circuit;
   measuring, for a particular integrated circuit, at least a portion of the timing distribution for the second set of timing paths by testing specific path-delays;
   comparing the measured timing distribution and the estimated timing distribution for the second set of timing paths;
   using parameters from the comparison of the second set of critical paths and from the timing distribution for the first set of critical timing paths to extrapolate a critical timing path distribution for the first set of critical timing paths that is particular to the particular integrated circuit; and
   grading the integrated circuit based at least partially on the extrapolated critical timing path distribution.

2. The method as defined in claim 1, wherein comparing comprises fitting.

3. A method for evaluating an integrated circuit device under test (DUT) using a first set and a second set of critical timing paths, the method comprising:
   testing the second set of critical timing paths for the DUT using at least one clock period corresponding to an operating frequency that is higher than a maximum operating speed associated with the DUT such that one or more critical timing paths from the second set fail during test; and
   extrapolating DUT-specific statistical data for the first set of critical timing paths by comparing actual data with estimated statistical data, wherein the actual data is derived from said testing of the second set of critical timing paths from the DUT.

4. The method of claim 3, wherein extrapolating DUT-specific statistical data further comprises:
   determining one or more parameters obtained from fitting of test data derived from said testing with non-DUT-specific statistical data of path timing distribution of the second set of critical timing paths; and
   applying the one or more parameters to non-DUT-specific statistical data for the path timing distribution of the first set of critical timing paths to generate DUT-specific statistical data.

5. The method of claim 4, further comprising generating the non-DUT-specific statistical data for the path timing distribution of the first set of critical timing paths, said generating comprising:

performing a timing analysis for the first set of critical timing paths;

generating a probability density function (PDF) from the timing analysis;

convolving the PDF with a distribution for process variations and a distribution for measurement error to generate a predicted probability distribution; and generating a complementary cumulative distribution function (CCDF) from the predicted probability distribution, wherein the CCDF comprises the non-DUT-specific statistical data for the path timing distribution of the first set of critical timing paths.

6. The method of claim 5, wherein the distribution for process variations and the distribution for measurement error are Gaussian.

7. The method of claim 5, wherein the distribution for process variations is selected at least partially based on monitored process variations.

8. The method of claim 4, further comprising generating the non-DUT-specific statistical data for the path timing distribution of the second set of critical timing paths, said generating comprising:

performing a timing analysis for the second set of critical timing paths;

generating a probability density function (PDF) from the timing analysis;

convolving the PDF with a distribution for process variations and a distribution for measurement error to generate a predicted probability distribution; and generating a complementary cumulative distribution function (CCDF) from the predicted probability distribution, wherein the CCDF comprises the non-DUT-specific statistical data for the path timing distribution of the first set of critical timing paths.

9. The method of claim 8, wherein the distribution for process variations and the distribution for measurement error are Gaussian.

10. The method of claim 8, wherein the distribution for process variations is selected at least partially based on monitored process variations.

11. The method of claim 3, further comprising sorting the DUT into one of a plurality of speed grades based at least in part on the DUT-specific statistical data.

12. The method of claim 3, further comprising successively increasing the operating speed until a predetermined number of errors is encountered.

13. The method of claim 3, further comprising adaptively determining the operating speed used for test based at least partially on the number of critical timing paths failing during test.

14. The method of claim 3, wherein the operating speed is selected based on at least one of predicted worst-case timing, process parameter measurements, or previous measurements.

15. The method of claim 3, wherein the second set comprises only measured critical timing paths and wherein the first set comprises both measured and non-measured critical timing paths.

16. The method of claim 3, wherein the second set of critical timing paths comprises a smaller subset of the first set of critical timing paths.

17. The method of claim 3, wherein the statistical data comprises a complementary cumulative distribution function (CCDF).

18. The method of claim 3, further comprising performing static timing analysis (STA) to generate estimated timing for at least a portion of the non-DUT-specific statistical data for the first set of critical timing paths.

19. The method of claim 3, further comprising performing static timing analysis (STA) to generate estimated timing for the non-DUT-specific statistical data for the second set of critical timing paths.

20. The method of claim 3, further comprising using data retrieved from a functional device to generate estimated timing for the non-DUT-specific statistical data for the second set of critical timing paths.

21. The method of claim 3, wherein extrapolating DUT-specific statistical data further comprises:

determining one or more parameters obtained from fitting using least squares of test data derived from said testing with non-DUT-specific statistical data of path timing distribution of the second set of critical timing paths; and applying the one or more parameters to non-DUT-specific statistical data for the path timing distribution of the first set of critical timing paths to generate DUT-specific statistical data.

22. The method of claim 3, wherein extrapolating DUT-specific statistical data further comprises:

determining one or more parameters obtained from fitting of test data derived from said testing with non-DUT-specific statistical data of path timing distribution of the second set of critical timing paths, wherein fitting comprises offsetting in time to reduce error between the test data and the non-DUT-specific statistical data of path timing distribution of the second set of critical timing paths; and applying the one or more parameters to non-DUT-specific statistical data for the path timing distribution of the first set of critical timing paths to generate DUT-specific statistical data.

23. The method of claim 3, wherein extrapolating DUT-specific statistical data further comprises:

determining one or more parameters obtained from fitting of test data derived from said testing with non-DUT-specific statistical data of path timing distribution of the second set of critical timing paths, wherein fitting comprises scaling to reduce error between the test data and the non-DUT-specific statistical data of path timing distribution of the second set of critical timing paths; and applying the one or more parameters to non-DUT-specific statistical data for the path timing distribution of the first set of critical timing paths to generate DUT-specific statistical data.

24. The method of claim 3, further comprising:

generating non-DUT-specific statistical data for the path timing distribution of the first set of critical timing paths, said generating comprising:

performing a timing analysis for the first set of critical timing paths;

generating a probability density function (PDF) from the timing analysis;

convolving the PDF with a distribution for process variations and a distribution for measurement error to generate a predicted probability distribution; and generating a complementary cumulative distribution function (CCDF) from the predicted probability distribution, wherein the CCDF comprises the non-DUT-specific statistical data for the path timing distribution of the first set of critical timing paths;

wherein extrapolating DUT-specific statistical data further comprises:

determining one or more parameters obtained from fitting of test data derived from said testing with non-DUT-specific statistical data of path timing distribution of the second set of critical timing paths, wherein fitting comprises varying at least one of process variation or measurement error parameters to modify the non-DUT-specific statistical data of path timing distribution of the second set of critical timing paths to reduce error between the test data and the non-DUT-specific statistical data of path timing distribution of the second set of critical timing paths; and applying the one or more parameters to non-DUT-specific statistical data for the path timing distribution of the first set of critical timing paths to generate DUT-specific statistical data.

25. The method of claim 3, wherein testing comprises testing path timing distribution with at least one of AC scan vectors, level-sensitive scan device (LSSD)-based AC scan vectors, or LSSD-based path delay measurements.

26. A system for evaluating an integrated circuit device under test (DUT) using a first set and a second set of critical timing paths, the system comprising:

test equipment configured to test the second set of critical timing paths for the DUT, the test conducted with at least one clock period corresponding to an operating frequency that is associated with a maximum operating speed such that one or more critical timing paths from the second set fail during test; and a processor configured to extrapolate DUT-specific statistical data for the first set of critical timing paths by comparing actual data with estimated statistical data, wherein the actual data is derived from said testing of the second set of critical timing paths from the DUT.

27. The system of claim 26, wherein the processor is further configured to determine one or more parameters obtained from fitting of test data derived from said test with non-DUT-specific statistical data of path timing distribution of the second set of critical timing paths, the processor further configured to apply the one or more parameters to non-DUT-specific statistical data for the path timing distribution of the first set of critical timing paths to generate DUT-specific statistical data.

28. The system of claim 27, wherein the processor is further configured to generate the non-DUT-specific statistical data for the path timing distribution of the first set of critical timing paths, the processor configured to:

perform a timing analysis for the first set of critical timing paths;

generate a probability density function (PDF) from the timing analysis;

convolve the PDF with a distribution for process variations and a distribution for measurement error to generate a predicted probability distribution; and generate a complementary cumulative distribution function (CCDF) from the predicted probability distribution.

29. The system of claim 26, wherein the processor is further configured to sort the DUT into one of a plurality of speed grades based at least in part on the DUT-specific statistical data.

30. A computer program embodied on a computer-readable medium for evaluating an integrated circuit device under test (DUT) using a first set and a second set of critical timing paths, the computer program embodied on the computer-readable medium comprising:

a module with instructions for testing the second set of critical timing paths for the DUT using at least one clock period corresponding to an operating frequency that is higher than a maximum operating speed associated with the DUT such that one or more critical timing paths from the second set fail during test;

a module with instructions for extrapolating DUT-specific statistical data for the first set of critical timing paths by comparing actual data with estimated statistical data, wherein the actual data is derived from said testing of the second set of critical timing paths from the DUT.

31. The computer program embodied on the computer-readable medium of claim 30, wherein the module with instruction for extrapolating further comprises:

a module with instructions for determining one or more parameters obtained from fitting of the test data with non-DUT-specific statistical data of path timing distribution of the second set of critical timing paths; and a module with instructions for applying the one or more parameters to non-DUT-specific statistical data for the path timing distribution of the first set of critical timing paths to generate DUT-specific statistical data.

32. The computer program embodied on the computer-readable medium of claim 31, further comprising a module for generating the non-DUT-specific statistical data for the path timing distribution of the first set of critical timing paths, said module for generating comprising:

a module with instructions for performing a timing analysis for the first set of critical timing paths;

a module with instructions for generating a probability density function (PDF) from the timing analysis;

a module with instructions for convolving the PDF with a distribution for process variations and a distribution for measurement error to generate a predicted probability distribution; and a module with instructions for generating a complementary cumulative distribution function (CCDF) from the predicted probability distribution, wherein the CCDF comprises the non-DUT-specific statistical data for the path timing distribution of the first set of critical timing paths.

33. The computer program embodied on the computer-readable medium of claim 30, further comprising a module with instructions for sorting the DUT into one of a plurality of speed grades based at least in part on the DUT-specific statistical data.

34. The computer program embodied on the computer-readable medium of claim 30, further comprising a module with instructions for adaptively determining the operating speed used for test based at least partially on the number of critical timing paths failing during test.

* * * * *